United States Patent
Liu et al.

(10) Patent No.: US 11,329,130 B2
(45) Date of Patent: May 10, 2022

(54) IGBT CHIP HAVING MIXED GATE STRUCTURE

(71) Applicant: ZHUZHOU CRRC TIMES ELECTRIC CO., LTD, Hunan (CN)

(72) Inventors: Guoyou Liu, Hunan (CN); Chunlin Zhu, Hunan (CN); Liheng Zhu, Hunan (CN)

(73) Assignee: ZHUZHOU CRRC TIMES ELECTRIC CO., LTD, Zhuzhou (CN)

( * ) Notice: Subject to any disclaimer, the term of this patent is extended or adjusted under 35 U.S.C. 154(b) by 63 days.

(21) Appl. No.: 16/969,604

(22) PCT Filed: Sep. 18, 2018

(86) PCT No.: PCT/CN2018/106117
§ 371 (c)(1),
(2) Date: Aug. 13, 2020

(87) PCT Pub. No.: WO2019/157820
PCT Pub. Date: Aug. 22, 2019

(65) Prior Publication Data
US 2021/0028278 A1  Jan. 28, 2021

(30) Foreign Application Priority Data

Feb. 13, 2018 (CN) .......................... 201810149376.7

(51) Int. Cl.
*H01L 29/06* (2006.01)
*H01L 29/423* (2006.01)
(Continued)

(52) U.S. Cl.
CPC ...... *H01L 29/0696* (2013.01); *H01L 29/4236* (2013.01); *H01L 29/4925* (2013.01); *H01L 29/7393* (2013.01)

(58) Field of Classification Search
CPC ............. H01L 29/7395; H01L 29/7428; H01L 29/0696; H01L 29/4236; H01L 29/7393;
(Continued)

(56) References Cited

U.S. PATENT DOCUMENTS

| 2009/0085103 A1* | 4/2009 | Hille | ................. H01L 29/66734 257/E29.345 |
| 2016/0043166 A1* | 2/2016 | Toyoda | ............... H01L 29/0615 257/330 |

FOREIGN PATENT DOCUMENTS

| CN | 105745758 A | 7/2016 |
| CN | 205621738 U | 10/2016 |

OTHER PUBLICATIONS

International Search Report of PCT Patent Application No. PCT/CN2018/106117 dated Dec. 26, 2018.

* cited by examiner

*Primary Examiner* — Didarul A Mazumder
*Assistant Examiner* — Wasiul Haider

(57) ABSTRACT

An IGBT chip having a mixed gate structure includes a plurality of mixed gate units. Each of the mixed gate units includes a source region (3) and a gate region. The gate region includes a planar gate region (1) and a trench gate region (2), which are respectively disposed at both sides of the source region (3). A planar gate and a trench gate are compositely disposed on the same cell (16), thereby greatly improving chip density while retaining both trench gate's features of low on-state energy loss and high current density and planar gate's feature of wide safe operating area.

16 Claims, 4 Drawing Sheets

(51) Int. Cl.
*H01L 29/49* (2006.01)
*H01L 29/739* (2006.01)
(58) Field of Classification Search
CPC .............. H01L 29/407; H01L 29/7396; H01L 29/7397; H01L 29/42336
See application file for complete search history.

IGBT CHIP HAVING MIXED GATE STRUCTURE

CROSS-REFERENCE TO RELATED APPLICATIONS

This application claims the priority of Chinese patent application CN201810149376.7, entitled "IGBT Chip Having Mixed Gate Structure" and filed on Feb. 13, 2018, the entirety of which is incorporated herein by reference.

FIELD OF THE INVENTION

The present disclosure relates to the technical field of semiconductor devices, and in particular, to an IGBT Chip having a mixed gate structure.

BACKGROUND OF THE INVENTION

Insulated gate bipolar transistor (IGBT) is a composite fully-controlled voltage drive type power semiconductor device formed by a bipolar junction transistor (BJT) and an insulated gate type metal-oxide-semiconductor field-effect transistor (MOSFET). Since the IGBT has features of low on-state voltage drop, large current density, high input impedance and fast response speed and so on, it is widely used in fields such as rail transit, smart grid, industrial frequency conversion and new energy development.

For existing technology, IGBT usually has a planar gate or a trench gate. the planar gate IGBT has simple manufacturing processes and less requirements for production equipment, moreover, the planar gate has a good blocking voltage capability. However, the MOS channel density is restricted by the chip surface area because the MOS channel region of the planar gate is located on the surface, it also results in a weak conductivity modulation and then a high on-state voltage drop. The trench gate IGBT changes the MOS channel from a lateral direction to a vertical direction, resulting in one-dimensional current channel and effectively eliminating a JFET effect in the planar gate structure. Concurrently, as the MOS channel density is not limited by the chip surface area any more, the cell density can be improved greatly, which will contribute very high current density. However, with increasing the trench gate density, the chip saturation current increases, which weakens the chip short circuit performance, and then narrows the chip safe operating area. Concurrently the chip reverse blocking voltage capability is also reduced due to the electric field crowding around the trench bottom.

Therefore, there is an urgent demand now for an IGBT chip with a high blocking voltage capability and a large saturation current, while keeping wide safe operating area unaffected by the saturation current.

SUMMARY OF THE INVENTION

The technical problem to be solved by the present disclosure is that an existing insulated gate bipolar transistor chip cannot ensure a high chip blocking voltage capability and a wide safe operating area while significantly improving a current density of the chip.

In order to solve the above problem, the present disclosure provides an IGBT chip having a mixed gate, including a wafer substrate and a plurality of cells sequentially arranged on an upper surface of the wafer substrate, wherein each of the cells includes two mixed gate units in mirror symmetry, wherein each of the mixed gate units includes a source region and a gate region which are disposed on the wafer substrate, wherein the gate region includes a planar gate region and a trench gate region which are disposed at two sides of the source region, wherein the trench gate region includes a trench gate sub-region located in the wafer substrate and an auxiliary sub-region located above the trench gate sub-region, wherein the trench gate sub-region includes a trench disposed in the wafer substrate, a first oxidation layer disposed on an internal surface of the trench, and polycrystalline silicon filled in the trench to form a trench gate, and the auxiliary sub-region includes a second oxidation layer formed on the upper surface of the wafer substrate, polycrystalline silicon formed on the second oxidation layer, and an insulation layer which encloses an external surface of the polycrystalline silicon on the second oxidation layer, wherein the polycrystalline silicon in the trench and the polycrystalline silicon in the auxiliary sub-region are connected with each other.

Preferably, the planar gate region includes a third oxidation layer located on the upper surface of the wafer substrate, polycrystalline silicon located on the third oxidation layer to form a planar gate, and an insulation layer which encloses an external surface of the polycrystalline silicon on the third oxidation layer.

Preferably, the source region includes:

a $P^+$ region, which is disposed between the planar gate region and the trench gate region;

a first $N^+$ region and a second $N^+$ region, which are disposed above the $P^+$ region;

a P well region, which is disposed below the $P^+$ region; and an N well region, which is disposed below the P well region.

Preferably, the first $N^+$ region is located below the planar gate region, and the second $N^+$ region is located below the auxiliary sub-region of the trench gate region.

Preferably, the source region further includes a metal layer which covers the planar gate region, the trench gate region, and the $P^+$ region.

Preferably, the metal layer is in contact and connected with the first $N^+$ region and the second $N^+$ region.

Preferably, the $P^+$ region is in contact and connected with the first $N^+$ region and the second $N^+$ region respectively.

Preferably, the planar gate and the trench gate are in short connection.

Preferably, each of the cells is in a shape of a regular hexagon, a square, or a strip, and the cells are arranged sequentially on the silicon.

Preferably, the IGBT chip further includes a back structure formed at a lower surface of the wafer substrate, wherein the back structure is of a punch-through type, a non-punch-through type, or a soft punch-through type.

Compared with the prior art, one or more embodiments of the above solution may have the following advantages and benefits.

According to the IGBT chip having a mixed gate provided by the embodiments of the present disclosure, the gate of the IGBT chip is arranged to be a mixed gate which includes both a planar gate and a trench gate, so that the IGBT chip not only has the planar gate advantages, i.e., good blocking voltage capability, but also has the trench gate advantages, i.e., increasing cell density so as to significantly increase the current density of the chip. Meanwhile, a dummy area is disposed between two trench gates of the cell of the IGBT chip having a mixed gate in the present application. Adjusting the size of the dummy area can optimize the electric field distribution in the source region, increase the total MOS channel corresponding to the planar gate region, tune the current density distribution and thermal equilibrium, therefore to improve reversed blocking voltage capability and high temperature performance.

Other features and advantages of the present disclosure will be further explained in the following description, and partially become self-evident therefrom, or be understood through the embodiments of the present disclosure. The objectives and other advantages of the present disclosure will be achieved and obtained through the structure specifically pointed out in the description, claims, and the accompanying drawings.

BRIEF DESCRIPTION OF THE DRAWINGS

The accompanying drawings are used to provide further understanding of the present disclosure and constitute one part of the description. The drawings are used for interpreting the present disclosure together with the embodiments of the present disclosure, not for limiting the present disclosure. In the drawings.

DETAILED DESCRIPTION OF THE EMBODIMENTS

The present disclosure will be explained in detail with reference to the accompanying drawings and the embodiments, whereby it can be fully understood how to solve the technical problem by the technical means according to the present disclosure and achieve the technical effects thereof, and thus the technical solution according to the present disclosure can be implemented. It should be noted that, as long as there is no conflict, the embodiments in the present disclosure and the technical features mentioned in the embodiments may be combined with one another in any manner, and the technical solutions obtained all fall within the scope of the present disclosure.

Since an IGBT has features of low on-state voltage drop, large current density, high input impedance and fast response speed and so on, it is widely used in various fields. For existing technology, IGBT usually has a planar gate or a trench gate. The planar gate IGBT has simple manufacturing processes and less requirements for production equipment, moreover, the planar gate has a good blocking voltage capability. However, the MOS channel density is restricted by the chip surface area, which results in a high on-state voltage drop. For an IGBT chip having the trench gate, the MOS channel is changed from a transverse channel to a longitudinal channel, resulting in one-dimensional current channel and significantly improving the chip current density. However, with increasing the trench gate density, the chip saturation current increases, which weakens the chip short circuit performance, and then narrows the chip safe operating area.

Embodiment One

In order to solve the above technical problem in the prior art, the present embodiment provides an IGBT having a mixed gate.

Figure 1:
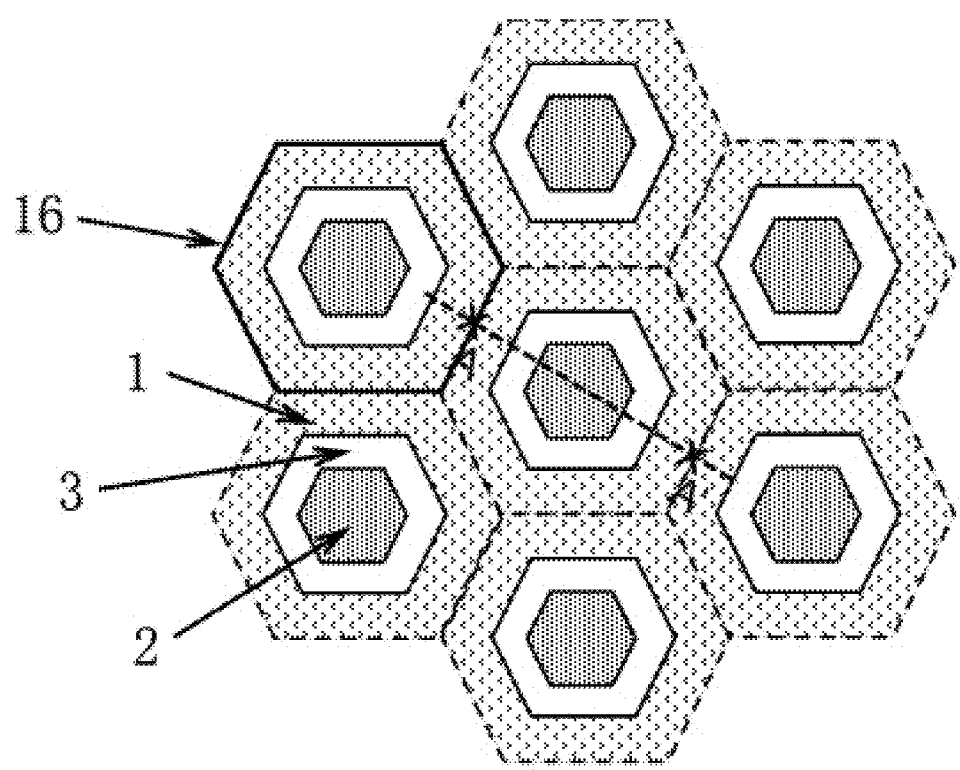
FIG. 1 shows a top view of a structure of an IGBT chip having a mixed gate according to Embodiment One of the present disclosures.
Figure 2:
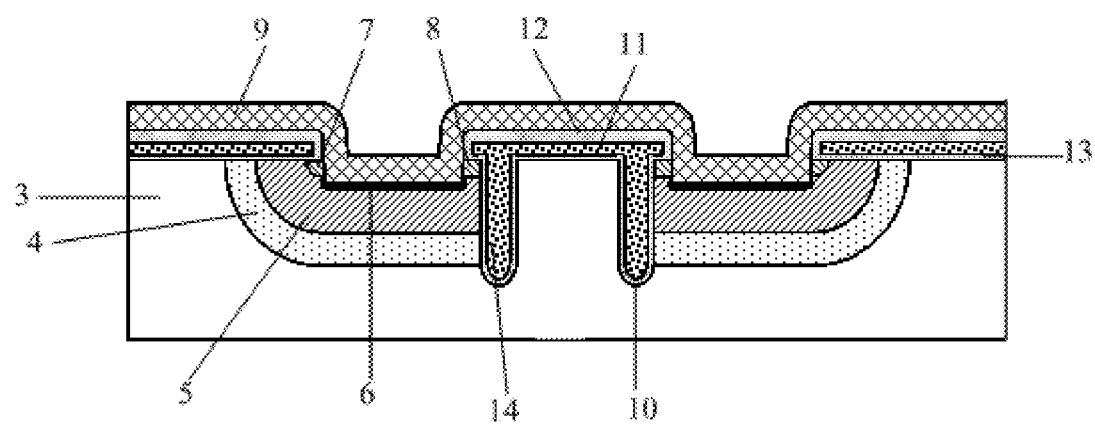
FIG. 2 schematically shows a structure of a cross-section in an A-A' direction for a cell in FIG. 1.

FIG. 1 shows a top view of a structure of an IGBT chip having a mixed gate according to Embodiment One of the present disclosures; and FIG. 2 schematically shows a structure of a cross-section in an A-A' direction for a cell in FIG. 1.

Referring to FIG. 1 and FIG. 2, the IGBT chip having a mixed gate according to the present embodiment includes a wafer substrate 15 and a plurality of cells 16 formed on an upper surface of the wafer substrate 15. Each of the cells 16 is in a shape of a regular hexagon, and the cells 16 are arranged on the wafer substrate 15 in a shape of a honeycomb. Each of the cells 16 includes two mixed gate units which are axisymmetric.

Each of the mixed gate units includes a source region 3 and a gate region which are disposed on the wafer substrate 15, and the gate region includes a planar gate region 1 and a trench gate region 2 which are disposed at two sides of the source region 3.

The trench gate region 2 includes a trench gate sub-region located on the wafer substrate 15 and an auxiliary sub-region located above the trench gate sub-region. Specifically, the trench gate sub-region includes a trench disposed in the wafer substrate 15, a first oxidation layer 10 disposed on an internal surface of the trench, and polycrystalline silicon 14 filled in the trench, and the polycrystalline silicon 14 in the trench forms a trench gate. The auxiliary sub-region includes a second oxidation layer 11 formed on the upper surface of the wafer substrate 15, polycrystalline silicon 14 formed on the second oxidation layer 11, and an insulation layer 12 which encloses an external surface of the polycrystalline silicon 14 formed on the second oxidation layer 11. The polycrystalline silicon 14 filled in the trench and the polycrystalline silicon 14 formed on the second oxidation layer 11 are in contact and connected with each other, and may be formed in a same process during manufacture of the IGBT chip so as to form an integrated structure. Preferably, the first oxidation layer 10 and the second oxidation layer 11 are made of silicon dioxide; and the insulation layer 12 is also made of silicon dioxide.

The planar gate region 1 includes a third oxidation layer 13 located on the upper surface of the wafer substrate 15, polycrystalline silicon 14 located on the third oxidation layer 13, and an insulation layer 12 which encloses an external surface of the polycrystalline silicon 14 on the third oxidation layer 13. Preferably, the insulation layer 12 and the third oxidation layer 13 of the planar gate region 1 are both made of silicon dioxide as well.

A planar gate and the trench gate are interconnected via a metal, so that the planar gate and the trench gate are jointly used as a mixed gate of the IGBT chip, and that simultaneous turned-on or turn-off of the planar gate and the trench gate can be realized.

In the present embodiment, the trench gate sub-region is in a shape of a regular hexagon in the cell 16. The auxiliary sub-region is located at the center of the cell 16, and forms an enclosed pattern at the center of the cell 16. The source region 3 is disposed on the periphery of the trench gate region 2. The planar gate region 1 is disposed on the periphery of the source region 3. That is, for a single cell 16, the planar gate region 1, the source region 3 and the trench gate region 2 are arranged sequentially from outside to inside. Since the cell 16 in the present embodiment is in a shape of a regular hexagon, a shape formed on the periphery of planar gate region 1 is a regular hexagon. Compared with the prior art, the auxiliary sub-region is disposed at the center of the cell 16 in the present embodiment, which effectively uses the trench gate sub-region to form a dummy area and further optimizes a structure of the cell 16.

It should be noted that the shape of the trench gate sub-region is not limited to the above regular hexagon, and the shape of the trench gate sub-region may also be a circle or another reasonable shape in other embodiments of the present disclosure; and the present disclosure is not limited thereto, either. Preferably, the IGBT chip further includes a back structure disposed at a lower surface of the wafer substrate 15, and the back structure may be of a punch-through type, a non-punch-through type, or a soft punch-through type.

The source region 3 includes an N well region 4 disposed in the wafer substrate 15, a P well region 5, a P+ region 6, an N+ region and a metal layer 9 sequentially from bottom to top. Specifically, the P+ region 6 is disposed between the planar gate region 1 and the trench gate region 2. The N+ region includes a first N+ region 7 and a second N+ region 8, which are respectively located at a side close to the planar gate region 1 and at a side close to the trench gate region 2 above the P+ region 6. The P+ region 6 is in contact and connected with the first N+ region 7 and the second N+ region 8 respectively, so that when the IGBT chip in the present embodiment is in operation, holes and electrons transporting can be realized through the P+ region 6 and the N+ region, respectively. Preferably, the first N+ region 7 and the second N+ region 8 are respectively located below the planar gate region 1 and below the auxiliary sub-region of trench gate region 2. The P well region 5 is located below the P+ region 6; and preferably, a portion of the P well region 5 is further located at one of two sides of the P+ region 6. That is, portions of the P well region 5 are located below the planar gate region 1 and at a left side or a right side of the trench gate region 2. The N well region 4 is located below the P well region 5; preferably, a portion of the N well region 4 is further located at one of two sides of P well region 5; and preferably, portions of the N well region 4 are also located below the planar gate region 1 and at a left side or a right side of the trench gate region 2. The above P well region 5 may be arranged as enclosing the P+ region 6, and the above N well region 4 may be arranged as enclosing the P well region 5.

The metal layer 9 covers the planar gate region 1, the trench gate region 2, and the P+ region 6 exposed between the planar gate region 1 and the trench gate region 2. The metal layer 9 is a source. Moreover, the metal layer 9 is in contact and connected with the first N+ region 7 and the second N+ region 8, so that when the IGBT chip in the present embodiment is in operation, holes and electrons transporting can be realized through the metal layer 9 and the P+ region 6 and through the metal layer 9 and the N+ region, respectively. Preferably, the metal layer is made of aluminum.

According to the IGBT chip having a mixed gate provided by the present embodiment, the gate of the IGBT chip is arranged to be a mixed gate which includes both a planar gate and a trench gate, so that the IGBT chip in the present embodiment not only has advantages of the planar gate, such as high chip blocking voltage capability and strong robustness, but also has advantages of the trench gate, such as one-dimensional current channel, no junction field-effect transistor (JFET) effect in a planar channel. Concurrently, as the MOS channel density is not limited by the surface area any more, the chip current density can be improved significantly. Besides, the trench gate region 2 in the present embodiment further includes an auxiliary sub-region disposed at the center of the cell 16, which effectively uses the trench gate sub-region to form a dummy area and further optimizes a structure of the cell 16. Meanwhile, the dummy area is disposed between two trench gates of the cell of the IGBT chip having a mixed gate in the present application. Adjusting the size of the dummy area can optimize the electric field distribution in the source region, increase the total MOS channel corresponding to the planar gate region, tune the current density distribution and thermal equilibrium, therefore to improve reversed blocking voltage capability and high temperature performance.

Embodiment Two

Figure 3:
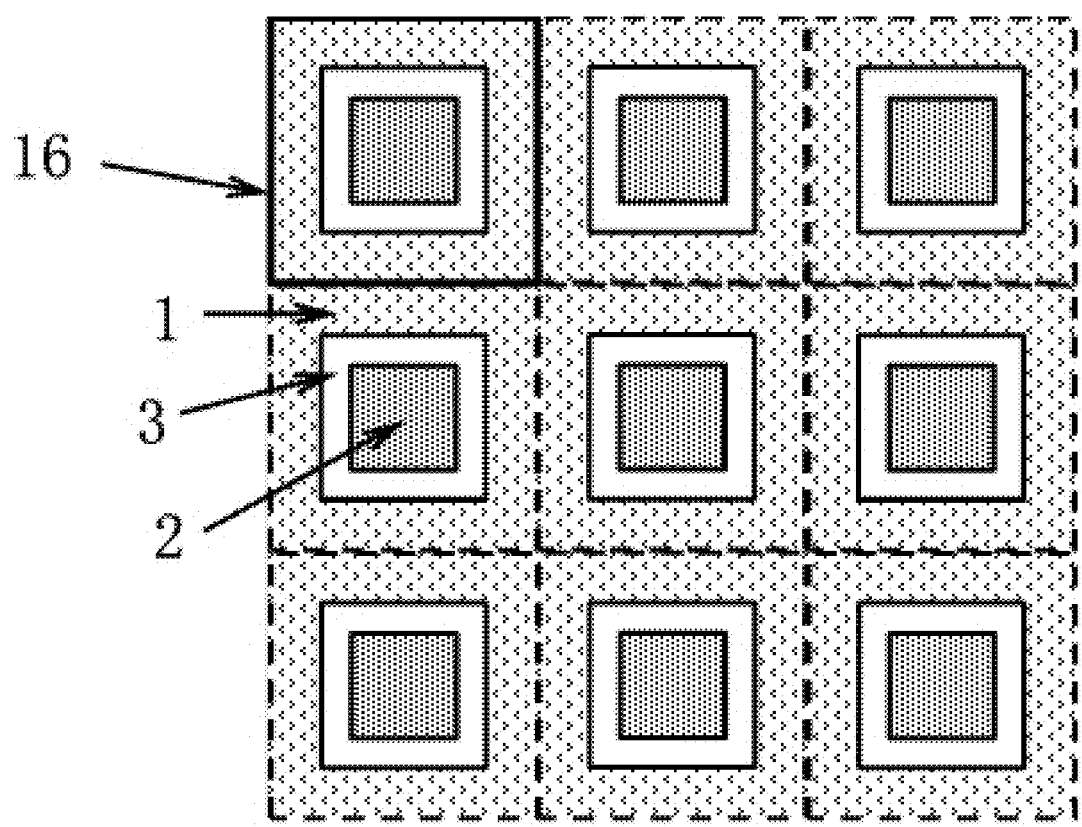
FIG. 3 shows a top view of a structure of an IGBT chip having a mixed gate according to Embodiment Two of the present disclosures.

Accordingly, FIG. 3 shows a top view of a structure of an IGBT chip having a mixed gate according to Embodiment Two of the present disclosures. Referring to FIG. 3, the present embodiment only redefines the shape of each of the cells 16, an arrangement manner of the cells 16 and a type of the structure of the IGBT chip on the basis of Embodiment One.

Specifically, each of the cells 16 in the present embodiment is in a shape of a square, and the cells 16 are arranged on the wafer substrate 15 in a shape of a matrix.

Further, the trench gate sub-region is in a shape of a square in the cell 16. The auxiliary sub-region is located at the center of the cell 16, and forms an enclosed pattern at the center of the cell 16. The source region 3 is disposed on the periphery of the trench gate region 2. The planar gate region 1 is disposed on the periphery of the source region 3. That is, for a single cell 16, the planar gate region 1, the source region 3 and the trench gate region 2 are also arranged sequentially from outside to inside. A shape formed on the periphery of planar gate region 1 is a square.

It should be noted that the shape of the trench gate sub-region is not limited to the above square, and the shape of the trench gate sub-region may also be a circle or another reasonable shape in other embodiments of the present disclosure; and the present disclosure is not limited thereto, either. Preferably, the IGBT chip further includes a back structure disposed at a lower surface of the wafer substrate 15, and the back structure may be of a punch-through type, a non-punch-through type, or a soft punch-through type.

According to the IGBT chip having a mixed gate provided by the present embodiment, the gate of the IGBT chip is arranged to be a mixed gate which includes both a planar gate and a trench gate, so that the IGBT chip in the present embodiment not only has advantages of the planar gate, such as high chip blocking voltage capability and strong robustness , but also has advantages of the trench gate, such as one-dimensional current channel, no junction field-effect transistor (JFET) effect in a planar channel. Concurrently, as the MOS channel density is not limited by the surface area any more, the chip current density can be improved significantly. Besides, the trench gate region 2 in the present embodiment further includes an auxiliary sub-region disposed at the center of the cell 16, which effectively uses the trench gate sub-region to form a dummy area and further optimizes a structure of the cell 16. Meanwhile, the dummy area is disposed between two trench gates of the cell of the IGBT chip having a mixed gate in the present application. Adjusting the size of the dummy area can optimize the electric field distribution in the source region, increase the total MOS channel corresponding to the planar gate region, tune the current density distribution and thermal equilibrium, therefore to improve reversed blocking voltage capability and high temperature performance.

Embodiment Three

Figure 4:
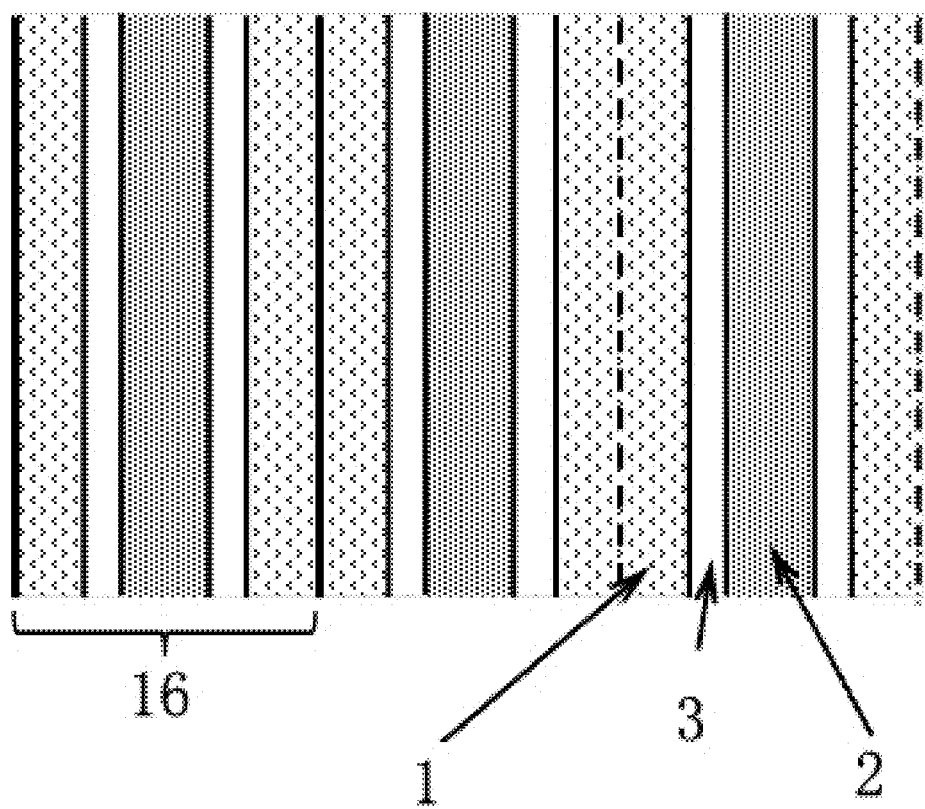
FIG. 4 shows a top view of a structure of an IGBT chip having a mixed gate according to Embodiment Three of the present disclosures.

Correspondingly, FIG. 4 shows a top view of a structure of an IGBT chip having a mixed gate according to Embodiment Three of the present disclosures. Referring to FIG. 4, the present embodiment only redefines the shape of each of the cells 16, an arrangement manner of the cells 16 and a type of the structure of the IGBT chip on the basis of Embodiment One.

Specifically, each of the cells 16 in the present embodiment has a cross-section in a shape of a strip, and the cells 16 are arranged in parallel on the wafer substrate 15 in a shape of a strip.

Further, the trench gate sub-region, the auxiliary sub-region, the source region 3 and the planar gate region 1 are all in a shape of a strip and are arranged sequentially. That is, for a single cell 16, the planar gate region 1, the source region 3 and the trench gate region 2 are also arranged sequentially. The auxiliary sub-region is located between two trench gate sub-regions, and forms an enclosed pattern.

It should be noted that the shape of the trench gate sub-region is not limited to the above strip, and the shape of the trench gate sub-region may also be another reasonable shape in other embodiments of the present disclosure; and the present disclosure is not limited thereto, either. Preferably, a bottom structure of the IGBT chip further includes a back structure disposed at a lower surface of the wafer substrate 15, and the back structure may be of a punch-through type, a non-punch-through type, or a soft punch-through type.

According to the IGBT chip having a mixed gate provided by the present embodiment, the gate of the IGBT chip is arranged to be a mixed gate which includes both a planar gate and a trench gate, so that the IGBT chip in the present embodiment not only has advantages of the planar gate, such as high chip blocking voltage capability and strong robustness, but also has advantages of the trench gate, such as one-dimensional current channel, no junction field-effect transistor (JFET) effect in a planar channel. Concurrently, as the MOS channel density is not limited by the surface area any more, the chip current density can be improved significantly. Besides, the trench gate region 2 in the present embodiment further includes an auxiliary sub-region disposed at the center of the cell 16, which effectively uses the trench gate sub-region to form a dummy area and further optimizes a structure of the cell 16. Meanwhile, the dummy area is disposed between two trench gates of the cell of the IGBT chip having a mixed gate in the present application. Adjusting the size of the dummy area can optimize the electric field distribution in the source region, increase the total MOS channel corresponding to the planar gate region, tune the current density distribution and thermal equilibrium, therefore to improve reversed blocking voltage capability and high temperature performance.

Although the embodiments of the present disclosure are disclosed as above, the above embodiments are described only for better understanding, rather than restricting, the present disclosure. Any person skilled in the art can make any amendment or change to the implementing forms or details without departing from the spirit and scope of the present disclosure. The protection scope of the present disclosure shall be determined by the scope as defined in the claims.

The invention claimed is:

1. An IGBT chip having a mixed gate, comprising a wafer substrate and a plurality of cells sequentially arranged on an upper surface of the wafer substrate, wherein each of the cells comprises two mixed gate units in mirror symmetry,
wherein each of the mixed gate units comprises a source region and a gate region which are disposed on the wafer substrate, wherein the gate region comprises a planar gate region and a trench gate region which are disposed at two sides of the source region respectively,
wherein the trench gate region comprises a trench gate sub-region located in the wafer substrate and an auxiliary sub-region located above the trench gate sub-region, wherein the trench gate sub-region comprises a trench disposed in the wafer substrate, a first oxidation layer disposed on an internal surface of the trench, and polycrystalline silicon filled in the trench to form a trench gate, and the auxiliary sub-region comprises a second oxidation layer formed on the upper surface of the wafer substrate, polycrystalline silicon formed on the second oxidation layer, and an insulation layer which encloses an external surface of the polycrystalline silicon on the second oxidation layer, wherein the polycrystalline silicon in the trench and the polycrystalline silicon in the auxiliary sub-region are connected with each other; and
wherein the source region comprises:
a P+ region, which is disposed between the planar gate region and the trench gate region;
a first N+ region and a second N+ region, which are disposed respectively at two sides above the P+ region;
a P well region, which is disposed below the P+ region; and
an N well region, which is disposed below the P well region.

2. The IGBT chip having a mixed gate according to claim 1, wherein the planar gate region comprises a third oxidation layer located on the upper surface of the wafer substrate, polycrystalline silicon located on the third oxidation layer to form a planar gate, and an insulation layer which encloses an external surface of the polycrystalline silicon on the third oxidation layer.

3. The IGBT chip having a mixed gate according to claim 2, wherein the planar gate and the trench gate are in short connection.

4. The IGBT chip having a mixed gate according to claim 1, wherein the first N+ region and the second N+ region are respectively located below the planar gate region and below the auxiliary sub-region of the trench gate region.

5. The IGBT chip having a mixed gate according to claim 4, wherein the source region further comprises a metal layer which covers the planar gate region, the trench gate region, and the P+ region.

6. The IGBT chip having a mixed gate according to claim 5, wherein the metal layer is in contact and connected with the first N+ region and the second N+ region.

7. The IGBT chip having a mixed gate according to claim 6, wherein the P+ region is in contact and connected with the first N+ region and the second N+ region respectively.

8. The IGBT chip having a mixed gate according to claim 6, wherein the planar gate and the trench gate are in short connection.

9. The IGBT chip having a mixed gate according to claim 5, wherein the P+ region is in contact and connected with the first N+ region and the second N+ region respectively.

10. The IGBT chip having a mixed gate according to claim 5, wherein the planar gate and the trench gate are in short connection.

11. The IGBT chip having a mixed gate according to claim 4, wherein the P+ region is in contact and connected with the first N+ region and the second N+ region respectively.

12. The IGBT chip having a mixed gate according to claim 4, wherein the planar gate and the trench gate are in short connection.

13. The IGBT chip having a mixed gate according to claim 1, wherein the P+ region is in contact and connected with the first N+ region and the second N+ region respectively.

14. The IGBT chip having a mixed gate according to claim 13, wherein the planar gate and the trench gate are in short connection.

15. The IGBT chip having a mixed gate according to claim 1, wherein the planar gate and the trench gate are in short connection.

16. The IGBT chip having a mixed gate according to claim 1, wherein each of the cells is in a shape of a regular hexagon, a square, or a strip.

* * * * *